(12) United States Patent
Guerra et al.

(10) Patent No.: US 11,678,434 B2
(45) Date of Patent: Jun. 13, 2023

(54) METHOD AND CIRCUIT FOR CONTROLLING QUALITY OF METALLIZATION OF A MULTILAYER PRINTED CIRCUIT BOARD

(71) Applicants: Continental Automotive France, Toulouse (FR); Continental Automotive GmbH, Hannover (DE)

(72) Inventors: Daniel Guerra, Toulouse (FR); Philippe Lehue, Toulouse (FR)

(73) Assignees: Continental Automotive France; Continental Automotive GmbH

( * ) Notice: Subject to any disclaimer, the term of this patent is extended or adjusted under 35 U.S.C. 154(b) by 184 days.

(21) Appl. No.: 17/286,939

(22) PCT Filed: Nov. 14, 2019

(86) PCT No.: PCT/EP2019/081363
§ 371 (c)(1),
(2) Date: Apr. 20, 2021

(87) PCT Pub. No.: WO2020/099579
PCT Pub. Date: May 22, 2020

(65) Prior Publication Data
US 2022/0240377 A1   Jul. 28, 2022

(30) Foreign Application Priority Data
Nov. 16, 2018  (FR) ........................ 1860575

(51) Int. Cl.
*H05K 1/02*   (2006.01)
(52) U.S. Cl.
CPC ... *H05K 1/0268* (2013.01); *H05K 2201/0776* (2013.01); *H05K 2201/09627* (2013.01);
(Continued)

(58) Field of Classification Search
CPC .................................................. H05K 1/0268
See application file for complete search history.

(56) References Cited

U.S. PATENT DOCUMENTS

2007/0090852 A1   4/2007   Poux et al.

FOREIGN PATENT DOCUMENTS

| DE | 202005014705 U1 | 11/2005 |
| FR | 2773264 A1 | 7/1999 |
| FR | 2892595 A1 | 4/2007 |

OTHER PUBLICATIONS

International Search Report and Written Opinion for International Application No. PCT/EP2019/081363, dated Mar. 9, 2020, with partial English translation, 8 pages.

(Continued)

*Primary Examiner* — Jeremy C Norris
(74) *Attorney, Agent, or Firm* — RatnerPrestia

(57) ABSTRACT

A multilayer printed circuit having a control circuit including n vias that are connected in series between a first and a second electrical terminal so that an applied electric current passes at least partially through each one of the n vias. The control circuit includes track portions in each one of the layers, each one of the n vias connecting a track portion of one layer to a track portion of another layer. The control circuit includes a measurement device for measuring a potential difference across its terminals, storage for storing a threshold value and a comparator for comparing the potential difference with the threshold value so as to validate the printed circuit when the potential difference is lower than the threshold value.

10 Claims, 2 Drawing Sheets

(52) U.S. Cl.
CPC .............. *H05K 2201/09663* (2013.01); *H05K 2201/09672* (2013.01)

(56) References Cited

OTHER PUBLICATIONS

International Search Report and Written Opinion for International Application No. PCT/EP2019/081363, dated Mar. 9, 2020, 12 pages (French).

METHOD AND CIRCUIT FOR CONTROLLING QUALITY OF METALLIZATION OF A MULTILAYER PRINTED CIRCUIT BOARD

CROSS REFERENCE TO RELATED APPLICATIONS

This application is the U.S. National Phase Application of PCT International Application No. PCT/EP2019/081363, filed Nov. 14, 2019, which claims priority to French Patent Application No. 1860575, filed Nov. 16, 2018, the contents of such applications being incorporated by reference herein.

FIELD OF THE INVENTION

The present invention relates to a method for controlling a quality of metallization of a printed circuit with multiple layers comprising an upper layer and a lower layer sandwiching at least one intermediate layer.

BACKGROUND OF THE INVENTION

Previously, the typical tests for controlling the quality of the metallization of printed circuits consisted of electrical continuity tests allowing possible discontinuity defects of the tracks formed to be detected. Such control tests thus allow surface defects of the metallized layers to be detected in an effective manner.

However, these typical tests do not provide any information as to the thickness of the deposited metallized layer, despite the importance of this manufacturing parameter.

To address this, document FR-A-2 892 595, incorporated herein by reference, discloses a method for controlling the thickness of the metallization of a printed circuit allowing systematic and rapid control of the printed circuits produced, the printed circuit comprising a superposed upper layer and lower layer.

The method provides for producing a control circuit including n through-holes, referred to as vias, with n being an integer greater than or equal to two. These vias are, on one hand, provided with an inner peripheral wall suitable for being coated with a metal border in the step of metallizing the printed circuit.

These vias are, on the other hand, electrically connected in series between two electrical terminals, so that an electric current applied between said electrical terminals passes through each one of the vias in the direction of its height.

The control circuit constitutes a reduced image of the printed circuit, allowing information representative of the thickness of the metallized layer formed on this printed circuit to be provided.

A current of defined intensity is then applied between the two electrical terminals of the control circuit and the corresponding potential difference between the electrical terminals is measured.

The measured value is then compared with a threshold value representative of the potential difference obtained for a metallized layer of predefined minimum thickness deposited on the peripheral wall of each hole, so as to validate the printed circuit when the measured value is lower than the threshold value.

This validation relates to the thickness of the metallized tracks that are present on the upper and lower layers and the metallized layers electrically connecting them. This document neither shows nor suggests how to control the thickness of the metallized tracks of one or more intermediate layers interposed between the upper and lower layers and the piercing of the metallized holes in each one of the layers, which must be centered with respect to their metal border surrounding them, as well as the positioning of the metal borders of the holes with respect to the tracks of each one of the layers.

Consequently, the problem underlying the present invention is, for a printed circuit having upper and lower layers and at least one intermediate layer interposed between the upper and lower layers, that of carrying out a non-destructive test of the printed circuit relating not only to the metallization of the holes and of the outer layers but also to the nominal thicknesses of conductive material forming the tracks of the one or more inner intermediate layers, to the centering of the piercing of the holes with respect to their metallization surrounding them and to the positioning of the metallized holes with respect to the inner tracks of each one of the layers.

SUMMARY OF THE INVENTION

To this end, an aspect of the present invention relates to a method for controlling a quality of metallization of a printed circuit with multiple layers comprising an upper layer and a lower layer sandwiching at least one intermediate layer, each layer having a track made of conductive material and through-holes referred to as vias that are provided with an inner peripheral wall suitable for being coated with a metal border in a step of metallizing the printed circuit, the method consisting:
  in producing a control circuit including n vias, with n being an integer greater than or equal to three, that are electrically connected in series between two electrical terminals, so that an electric current applied between said electrical terminals passes at least partially through each one of the n vias in the direction of its height,
  in applying a current of defined intensity between the two electrical terminals of the control circuit,
  in measuring the corresponding potential difference, and
  in comparing the measured value with a threshold value representative of the potential difference so as to validate the printed circuit when the measured value is lower than the threshold value,
noteworthy in that the control circuit is configured to pass through at least a portion of a track of each one of the layers of the printed circuit, each one of the n vias connecting a track portion of one layer to a track portion of another layer, the threshold value being representative of a potential difference obtained for:
  n vias of the control circuit that are provided with a metal border of predefined minimum thickness deposited on a peripheral wall of each via between the two layers that the via connects,
  an alignment of the metal border located at each layer with the track portion on the layer, and
  a minimum thickness of metallization of the portions of the tracks on each one of the layers of the control circuit.

The technical effect obtained by an aspect of the present invention is that of controlling, in one global measurement, the whole of the production quality of the printed circuit.

The new pattern of the control circuit consists in connecting the old pattern proposed by the closest prior art illustrated by FR-A-2 892 595 by passing through all the layers including outer layers, such as the upper and lower layers, and inner layers, such as the one or more intermediate layers.

The control circuit passes through all the layers and track portions of each layer that are made of a metal material such as copper, advantageously by distributing the number of connections in proportion to the thicknesses of the metal material.

An aspect of the present invention makes it possible to detect, in addition to a lack of overmetallization of the external faces of the printed circuit which the upper and lower layers constitute and to a lack of metallization of the vias, which could also be achieved by the closest prior art, an excessively low thickness of metallization of the one or more intermediate layers and a misalignment of the vias with respect to the track portions which should be connected to them.

A misalignment of the piercings in a via will cause an increase in the electrical resistance of the control circuit, due to the fact that the metal borders or lands surrounding the piercings will no longer have the same metallized geometry for conducting the electric current passing through the control circuit.

Thus, the method according to an aspect of the present invention extends the control method according to the closest prior art by adapting it to a printed circuit with multiple layers.

Advantageously, a number of track portions of the control circuit on one and the same layer of the printed circuit is selected depending on a nominal track metallization thickness on said layer. This allows the control circuit for controlling the differences in the thicknesses of metallization found on various layers to be made representative.

Advantageously, the layers are of rectangular planar shape and have a width and a length, the track portions of the control circuit on one and the same layer being divided into track portions extending in the direction of the width and track portions extending in the direction of the length of the layer.

There may be an offset of the piercings made in their land forming an associated metal border surrounding them, leading to an offset between the vias and the track portions on a given layer, this offset potentially being mainly in the two dimensions of the layer and causing the total electrical resistance of the pattern to rise. Such a widthwise and/or lengthwise offset may be controlled effectively by the method for controlling quality of metallization of a printed circuit according to an aspect of the present invention.

An aspect of the invention also relates to a printed circuit including an upper layer and a lower layer sandwiching at least one intermediate layer, each layer having a track made of conductive material and through-holes referred to as vias that are provided with an inner peripheral wall coated with a metal border, noteworthy in that the printed circuit comprises a control circuit implementing such a control method, the control circuit including n vias that are electrically connected in series between a first and a second electrical terminal so that an electric current applied between the electrical terminals passes at least partially through each one of the n vias in the direction of its height, the control circuit comprising track portions in each one of the layers of the printed circuit, each one of the n vias connecting a track portion of one layer to a track portion of another layer, the control circuit comprising measurement means for measuring a potential difference across its terminals, storage means for storing a threshold value and comparison means for comparing the measured potential difference with the threshold value so as to validate the printed circuit when the measured potential difference is lower than the threshold value.

The control circuit passes locally through each one of the layers while controlling the metallization of the vias and their connection with track portions present on each one of the layers, as well as the metal thickness of the track portions, in order to establish a complete diagnosis of the compliance of the printed circuit.

Advantageously, the printed circuit includes at least four superposed layers, the control circuit including a number n of vias at least equal to 30 with 8 track portions on the upper layer, 9 track portions on the lower layer, 6 track portions on a first intermediate layer and 6 track portions on a second intermediate layer, the thicknesses of metallization of the track portions of the upper and lower layers being equal and the minimum thicknesses of metallization of the portions of the tracks of the first and second intermediate layers being equal and 35 to 65% less than the thicknesses of metallization of the track portions of the upper and lower layers.

The number of track portions on a layer forming part of the control circuit with respect to the number of track portions on a layer takes account of the ratio of metallization thickness between the two layers.

Advantageously, for the upper layer: 4 track portions extend in the direction of the width and 4 track portions extend in the direction of the length of the upper layer; for the first intermediate layer starting from the upper layer: 3 track portions extend in the direction of the width and 3 track portions extend in the direction of the length of the first intermediate layer; for the second intermediate layer starting from the upper layer: 3 track portions extend in the direction of the width and 3 track portions extend in the direction of the length of the second intermediate layer; and, for the lower layer: 6 track portions extend in the direction of the width and 3 track portions extend in the direction of the length of the lower layer.

Advantageously, the first electrical terminal consists of two conductive pads connected to one another by a conductive track and one of said pads is connected by a conductive track to the first via of the n vias and the second electrical terminal consists of two conductive pads connected to one another by a conductive track and one of said pads is connected by a conductive track to the last via of the n vias, the first and second electrical terminals being borne by the upper layer of the printed circuit.

Advantageously, the n vias of the control circuit each have a diameter equivalent to the smallest diameter of the other vias of the printed circuit.

Advantageously, the track portions of the control circuit on each layer have a thickness equivalent to the thickness of the track extending over said layer.

Advantageously, the control circuit is integrated into a functional part of the printed circuit.

BRIEF DESCRIPTION OF THE DRAWINGS

Other features, aims and advantages of aspects of the present invention will become apparent from reading the detailed description that follows and from examining the appended drawings given by way of non-limiting examples, and in which.

DETAILED DESCRIPTION OF THE PREFERRED EMBODIMENTS

Figure 1:
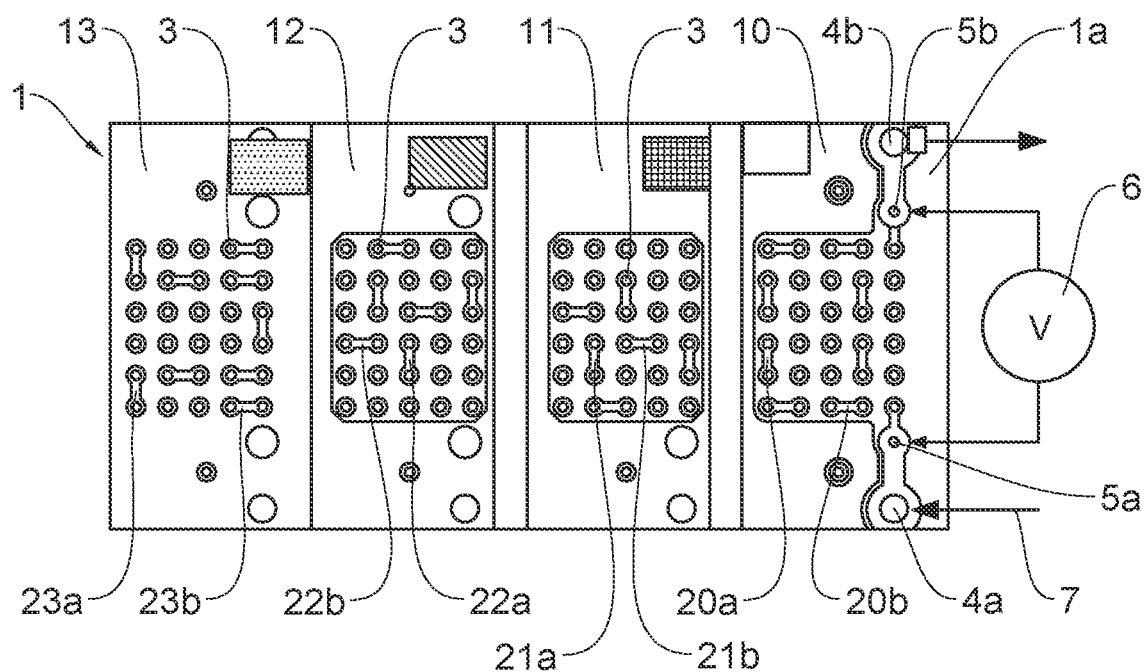
FIG. 1 is a schematic representation of a view of a printed circuit with multiple layers provided with a control circuit according to one embodiment of the present invention, the layers being shown positioned side by side in order to be visible instead of being superposed as in a final printed circuit.
Figure 2:
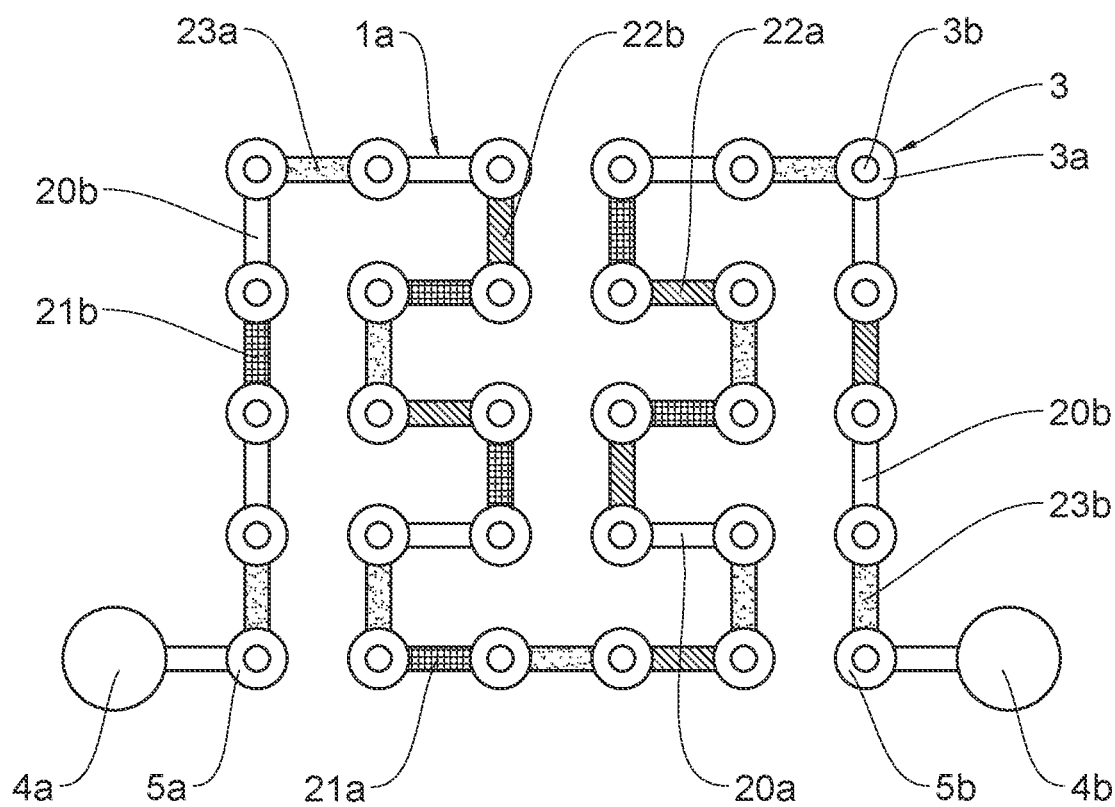
FIG. 2 is a schematic representation of a view from above of the control circuit for a printed circuit with multiple layers according to one embodiment of the present invention, the tracks present on various superposed layers being made visible in this figure and identified with respect to the layer bearing them.

In FIGS. 1 and 2, only one metallized hole or via is referenced 3 per layer of the printed circuit, only one track portion extending in the direction of the length and one track portion extending in the direction of the width are referenced 20a, 20b; 21a, 21b; 22a, 22b and 23a, 23b, respectively, according to the layer of the printed circuit which bears them, but what is disclosed for one referenced element is disclosed for all the elements of the same type that are not referenced.

Referring to all the figures and mainly to FIGS. 1 and 2, an aspect of the present invention relates to a method for controlling a quality of metallization of a printed circuit 1 with multiple layers 10 to 13 comprising an upper layer 10 and a lower layer 13 sandwiching at least one intermediate layer 11, 12.

In FIGS. 1 and 2, a printed circuit 1 is illustrated including four layers 10 to 13 with an upper layer 10 and a lower layer 13 sandwiching at least a first intermediate layer 11 and a second intermediate layer 12. This is not limiting and the printed circuit 1 may also comprise 3 layers, as well as comprise more than four layers.

Each layer 10 to 13 has a track made of conductive material and through-holes referred to as vias 3 that are provided with an inner peripheral wall that is metallized in a step of metallizing the printed circuit 1, in order to have a metal border of the via.

The method consists in producing a control circuit 1a including n vias 3, with n being an integer greater than or equal to three, that are electrically connected in series between two electrical terminals 4a, 4b. This is done in such a way that an electric current applied between said electrical terminals 4a, 4b passes at least partially through each one of the n vias 3 in the direction of its height.

At least partially means that some of the vias 3 are passed through by the electric current from the upper layer 10 or from the lower layer 13 to the first 11 or the second intermediate layer 12 or vice versa while other vias 3 are passed all the way through from the upper layer 10 to the lower layer 13 or vice versa.

The method provides for applying a current of predefined intensity between the two electrical terminals 4a, 4b of the control circuit 1a. This is shown in FIG. 1 by a voltage generator connected to the electrical terminals 4a, 4b of the control circuit 1a, one electrical connection of which is referenced 7.

Then, at 6, the corresponding potential difference across the electrical terminals 4a, 4b of the control circuit 1a is measured and a comparison is performed between the measured voltage value and a threshold value that is representative of the potential difference so as to validate the printed circuit 1 when the measured value is lower than the threshold value.

What may make a printed circuit 1 non-compliant is first of all an insufficient thickness of conductive material, notably of copper, of a track on at least one of the layers 10 to 13 of the printed circuit 1, this layer potentially being an upper layer 10, a lower layer 13, or the or one of the intermediate layers 11 or 12. A control method according to the closest prior art did not allow the thickness of conductive material of the one or more intermediate layers 11, 12 to be verified.

Figure 4:
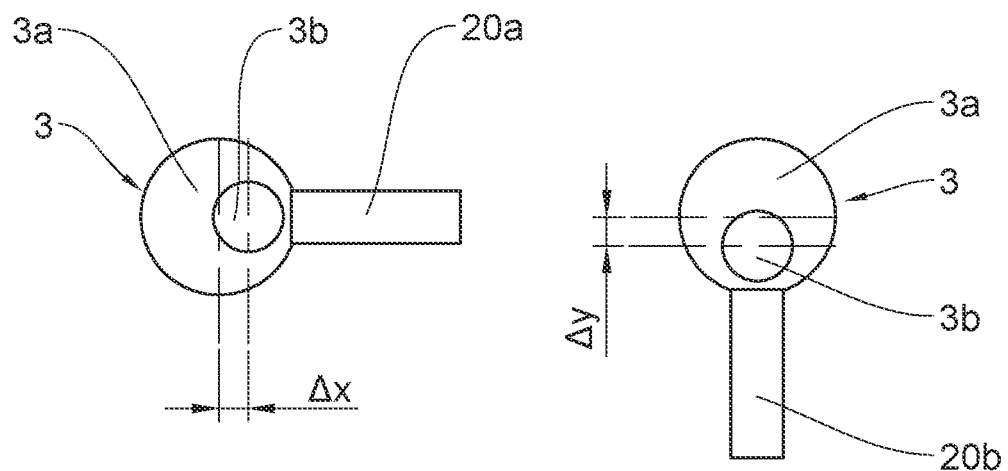
FIG. 4 shows the possible off-centering, respectively in one of two, lateral and longitudinal, dimensions, of a metallized hole forming a via with respect to its metal border surrounding it and with respect to a track portion connected to this metallized hole at a layer of the printed circuit, such an off-centering potentially making the printed circuit non-compliant and being detected by the implementation of the control method for controlling a quality of metallization of a printed circuit with multiple layers according to an aspect of the present invention.

Next, referring particularly to FIG. 4 in combination with the other figures, what may make a printed circuit 1 non-compliant is a poor alignment of the piercing of a metallized hole in its metal border or metallized land made of conductive material, the piercing 3b having to pass through the metal border or metallized land 3a in a median zone of the land or metal border. A poor alignment increases the electrical resistance of the control circuit 1a and allows the non-compliance of a printed circuit 1 to be detected.

Moreover, still referring particularly to FIG. 4 in combination with FIGS. 1 and 2, what may make a printed circuit 1 non-compliant is a deficient electrical connection between the via 3 and a track portion 20a to 23a; 20b to 23b that is present on one of the layers 10 to 13, this increasing the electrical resistance of the control circuit 1a and allowing the non-compliance of a printed circuit 1 to be detected.

As will be seen below, notably in FIG. 1, one or more track portions 20a to 23a; 20b to 23b on each one of the layers 10 to 13 may extend in the direction of the width or in the direction of the length of the layer 10 to 13. An offset of the piercing in either of these two directions with respect to the associated track portion 20a to 23a; 20b to 23b may increase the electrical resistance of the control circuit 1a and allow a non-compliance of the printed circuit 1 to be detected.

A lengthwise offset and a widthwise offset of the piercing of the via 3 are referenced Δx and Δy, respectively, in FIG. 4. In FIG. 4, the track portions extending lengthwise and widthwise are referenced 20a and 20b as present on the upper layer 10 of the printed circuit 1, but this is not limiting and could relate to track portions 20a to 23a; 20b to 23b of all the layers 10 to 13 of the printed circuit 1.

The control circuit 1a may thus use some of the vias 3 of the printed circuit 1 to perform a non-compliance test on the printed circuit 1. When at least one of the aforementioned defects of one or the vias 3 of the control circuit 1a is detected, it is certain that this or these defects also affect one or more vias 3 of the printed circuit 1.

In general, an alignment defect of the piercing 3a in a land or metal border 3b of a via 3 or a defect of an electrical connection with a track portion will also concern other vias 3 of the printed circuit 1, since the piercings are carried out simultaneously and in correspondence with each other.

Figure 3:
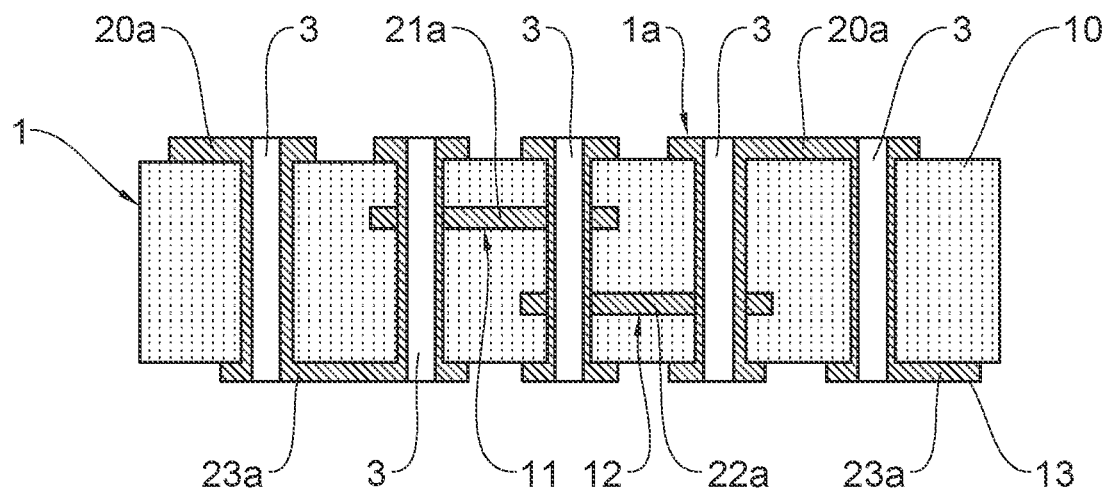
FIG. 3 is a schematic representation of a view in cross section of a control circuit for a printed circuit with multiple layers according to one embodiment of the present invention, the metallized vias extending in the direction of the thickness of the printed circuit being visible in this figure as well as the track portions present on the various layers forming part of the control circuit at this cross section.

Referring more particularly to FIGS. 1 to 3, for the implementation of the method according to an aspect of the invention, the control circuit 1a is configured to pass through at least a portion of a track 20a to 23a; 20b to 23b of each one of the layers 10 to 13 of the printed circuit 1. Each one of the n vias 3 connects a track portion 20*a* to 23*a*; 20*b* to 23*b* of one layer 10 to 13 to a track portion 20*a* to 23*a*; 20*b* to 23*b* of another layer 10 to 13.

The threshold value for determining whether a printed circuit 1 is compliant or not is representative of a potential difference obtained for n vias 3 of the control circuit 1*a* that are provided with a metal border of predefined minimum thickness that is deposited on a peripheral wall of each via 3 between the two layers 10 to 13 which the via 3 connects, for an alignment of the metal border located at each layer 10 to 13 with the track portion 20*a* to 23*a*; 20*b* to 23*b* on the layer and for a minimum thickness of metallization of the track portions on each one of the layers 10 to 13 of the control circuit 1*a*.

Too low a thickness for the land or metal border of the vias 3 or for the track portions 20*a* to 23*a*; 20*b* to 23*b* or a misalignment will increase the resistance of the control circuit 1*a*, the voltage across the terminals of which is measured, and allow a non-compliant printed circuit 1 to be detected.

It may be judicious to undertake a preliminary calibration step consisting in recording the potential differences measured for given thicknesses of layers 10 to 13 deposited inside the vias 3 of a prototype control circuit 1*a*. Subsequently, once this calibration step has been performed, the method according to an aspect of the invention makes it possible, directly on the production line, to control all the printed circuits 1 with multiple layers 10 to 13 systematically and in a very short period, and thus to detect all the pieces subject to a metallization defect, that is to say the thickness of the metallization layer of which is less than that required, or vias 3 with piercings that are poorly aligned in their land or with their track portions 20*a* to 23*a*; 20*b* to 23*b*.

A number of track portions 20*a* to 23*a*; 20*b* to 23*b* of the control circuit 1*a* on one and the same layer 10 to 13 of the printed circuit 1 may be selected depending on a nominal track metallization thickness on said layer 10 to 13. Without this being limiting, the upper 10 and lower 13 layers may have a metallization thickness of 60 microns, while the intermediate layer 11, 12 or the first and second intermediate layers 11, 12 may have a metallization thickness of 35 microns.

The layers 10 to 13 may be of rectangular planar shape having a width and a length, advantageously on a board, the vias 3 extending in the thickness of the printed circuit 1, a current flowing through the vias 3 in the direction of the thickness of the printed circuit 1, this current coming from an electrical power supply circuit, one electrical connection of which is referenced 7.

The track portions 20*a* to 23*a*; 20*b* to 23*b* of the control circuit 1*a* on one and the same layer 10 to 13 may be divided into track portions extending in the direction of the width 20*a* to 23*a* and track portions 20*b* to 23*b* extending in the direction of the length of the layer 10 to 13. This is visible in FIGS. 1 and 2.

In FIG. 3, the control circuit 1*a* passes from the upper layer 10 to the lower layer 13 through a first via 3 then from the lower layer 13 to the first intermediate layer 11 closest to the upper layer 10 of the two intermediate layers 11 to 12 through a second via 3.

Next, the control circuit 1*a* passes from the first intermediate layer 11 to the second intermediate layer 12 through a third via 3 then from the second intermediate layer 12 to the upper layer 10 through a fourth via 3 and finally from the upper layer 10 to the lower layer 13 of the printed circuit 1 through a fifth via 3. Thus, all the layers 10 to 13 of the printed circuit 1 are tested, which is not the case for all the vias 3, only a number n of vias 3 being tested.

Referring notably to FIGS. 1 to 3, an aspect of the invention also relates to a printed circuit 1 including an upper layer 10 and a lower layer 13 sandwiching at least one intermediate layer 11, 12, each layer 10 to 13 having a track made of conductive material and through-holes referred to as vias 3 that are provided with an inner peripheral wall coated with a metal border.

According to an aspect of the invention, the printed circuit 1 comprises a control circuit 1*a* which implements a control method such as previously described, the control circuit 1*a* including n vias 3 that are electrically connected in series between a first 4*a* and a second electrical terminal 4*b* so that an electric current applied between the electrical terminals 4*a*, 4*b* passes at least partially through each one of the n vias 3 in the direction of its height, n being at least equal to three.

The control circuit 1*a* comprises track portions 20*a* to 23*a*; 20*b* to 23*b* in each one of the layers 10 to 13 of the printed circuit 1, each one of the n vias 3 connecting a track portion 20*a* to 23*a*; 20*b* to 23*b* of one layer 10 to 13 to a track portion 20*a* to 23*a*; 20*b* to 23*b* of another layer 10 to 13.

The control circuit 1*a* comprises measurement means 6 for measuring a potential difference V across its terminals, storage means for storing a threshold value and comparison means for comparing the measured potential difference with the threshold value so as to validate the printed circuit 1 when the measured potential difference is lower than the threshold value.

The control circuit 1*a* may be produced on a portion of the functional surface of each printed circuit 1 manufactured or on technical strips such as those ensuring the mechanical connection of the printed circuits during the manufacture of the printed circuits.

Referring more particularly to FIGS. 1 and 2, the printed circuit 1 may include at least four superposed layers 10 to 13. In FIG. 2, the track portions without a distinctive mark 20*a*, 20*b* are track portions present on the upper layer 10 of the printed circuit 1 and the track portions with dots 23*a*, 23*b* are track portions present on the lower layer 13 of the printed circuit 1. In FIG. 1, the distinctive marks for each one of the layers 10 to 13 are shown in a small square.

The checkered track portions 21*a*, 21*b* are track portions present on the first intermediate layer 11 of the printed circuit 1 and the track portions with hatching 22*a*, 22*b* are track portions present on the second intermediate layer 12 of the printed circuit 1.

The control circuit 1*a* may include a number n of vias 3 at least equal to 30 with 8 track portions 20*a*, 20*b* on the upper layer 10, 9 track portions 23*a*, 23*b* on the lower layer 13, 6 track portions 21*a*, 21*b* on a first intermediate layer 11 and 6 track portions 22*a*, 22*b* on a second intermediate layer 12, the total number of track portions being 1 less than the number of vias 3.

The thicknesses of metallization of the track portions 20*a*, 20*b*; 23*a*, 23*b* of the upper 10 and lower 13 layers may be equal and the minimum thicknesses of metallization of the track portions 21*a*, 21*b*; 22*a*, 22*b* of the first and second intermediate layers 11, 12 may also be equal while being 35 to 65% less than the thicknesses of metallization of the track portions of the upper 10 and lower 13 layers.

Referring more particularly to FIG. 1, the upper layer 10 may comprise 4 track portions 20*a* extending in the direction of the width and 4 track portions 20*b* extending in the direction of the length of the upper layer 10. The first intermediate layer 11, which is the first one starting from the upper layer 10, may comprise 3 track portions 21*a* extending in the direction of the width and 3 track portions 21b extending in the direction of the length of the first intermediate layer 11.

The second intermediate layer 12 starting from the upper layer 10 may comprise 3 track portions 22a extending in the direction of the width and 3 track portions 22b extending in the direction of the length of the second intermediate layer 12. Finally, the lower layer 13 may comprise 6 track portions 23a extending in the direction of the width and 3 track portions 23b extending in the direction of the length of the lower layer 13.

The pattern previously described and shown notably in FIG. 2 is given by way of principle for a printed circuit 1 with four layers 10 to 13, but may be extended to more layers, for example 6 layers or 8 layers, or even more. In the case of variation in the number of layers of the printed circuit 1, the control circuit 1a is redefined so as to pass equitably over all the layers for test coverage.

As may be seen in notably in FIGS. 1 and 2, the first electrical terminal 4a may consist of two conductive pads 4a, 5a connected to one another by a conductive track and one of said pads is connected by a conductive track to the first via of the n vias 3.

The same applies for the second electrical terminal 4b, which may consist of two conductive pads 4b, 5b connected to one another by a conductive track and one of said pads 5b is connected by a conductive track to the last via of the n vias 3.

The first and second electrical terminals 4a, 4b, that are connected to an electrical power supply circuit 7 external to the printed circuit 1, may be borne by the upper layer 10 of the printed circuit 1 but this is not limiting, it being possible for the first and second electrical terminals 4a, 4b to be borne by the lower layer 13 of the printed circuit 1, and this in preference to the or one of the intermediate layers 11 to 12.

The n vias 3 of the control circuit 1a may each have a diameter equivalent to the smallest diameter of the other vias 3 of the printed circuit 1. This allows the resistance of the control circuit 1a to be aligned with the highest resistance obtained in the printed circuit 1. However, in general all the vias 3 of the printed circuit 1 have the same diameter.

The track portions 20a to 23a; 20b to 23b of the control circuit 1a on each layer 10 to 13 may have a thickness equivalent to the thickness of the track extending over said layer 10 to 13. This is the case when the control circuit 1a is integrated into a functional part of the printed circuit 1.

An aspect of the present invention may be applied to any printed circuit 1 with connecting vias 3, particularly to a printed circuit board 1, but may also be applied to substrates other than that of a printed circuit board. SMI technology, a substrate made of plastic or of another insulator with copper tracks connected to one another by metallized vias 3 may also be used.

The invention claimed is:

1. A method for controlling a quality of metallization of a printed circuit with multiple layers comprising an upper layer and a lower layer sandwiching at least one intermediate layer, each layer having a track made of conductive material and through-holes referred to as vias that are provided with an inner peripheral wall suitable for being coated with a metal border in a step of metallizing the printed circuit, the method comprising:

producing a control circuit including n vias, with n being an integer greater than or equal to three, that are connected electrically in series between two electrical terminals, so that an electric current applied between said electrical terminals passes at least partially through each one of the n vias in the direction of its height, applying a current of defined intensity between the two electrical terminals of the control circuit, measuring the corresponding potential difference, and comparing the measured value with a threshold value representative of the potential difference so as to validate the printed circuit when the measured value is lower than the threshold value, wherein the control circuit is configured to pass through at least a portion of a track of each one of the layers of the printed circuit, each one of the n vias connecting a track portion of one layer to a track portion of another layer, the threshold value being representative of a potential difference obtained for:

n vias of the control circuit that are provided with a metal border of predefined minimum thickness deposited on a peripheral wall of each via between the two layers that the via connects, an alignment of the metal border located at each layer with the track portion on the layer, and a minimum thickness of metallization of the track portions on each one of the layers of the control circuit, wherein the printed circuit comprises at least three superposed layers including the upper layer, the lower layer, and the intermediate layer.

2. The method as claimed in claim 1, wherein a number of track portions of the control circuit on one and the same layer of the printed circuit is selected depending on a nominal track metallization thickness on said layer.

3. The method as claimed in claim 1, wherein the layers are of rectangular planar shape and have a width and a length, the track portions of the control circuit on one and the same layer being divided into track portions extending in the direction of the width and track portions extending in the direction of the length of the layer.

4. A printed circuit including an upper layer and a lower layer sandwiching at least one intermediate layer, each layer having a track made of conductive material and through-holes referred to as vias that are provided with an inner peripheral wall coated with a metal border, wherein the printed circuit comprises a control circuit implementing a control method as claimed in claim 1, the control circuit including n vias that are connected electrically in series between a first and a second electrical terminal so that an electric current applied between the electrical terminals passes at least partially through each one of the n vias in the direction of its height, the control circuit comprising track portions in each one of the layers of the printed circuit, each one of the n vias connecting a track portion of one layer to a track portion of another layer, the control circuit comprising measurement means for measuring a potential difference across its terminals, storage means for storing a threshold value and comparison means for comparing the measured potential difference with the threshold value so as to validate the printed circuit when the measured potential difference is lower than the threshold value.

5. The printed circuit as claimed in claim 4, further comprising at least four superposed layers, the control circuit including a number n of vias at least equal to 30 with 8 track portions on the upper layer, 9 track portions on the lower layer, 6 track portions on a first intermediate layer and 6 track portions on a second intermediate layer, the thicknesses of metallization of the track portions of the upper and lower layers being equal and the minimum thicknesses of metallization of the track portions of the first and second intermediate layers being equal and 35 to 65% less than the thicknesses of metallization of the track portions of the upper and lower layers.

6. The printed circuit as claimed in claim 5, wherein, for the upper layer: 4 track portions extend in the direction of the width and 4 track portions extend in the direction of the length of the upper layer; for the first intermediate layer starting from the upper layer: 3 track portions extend in the direction of the width and 3 track portions extend in the direction of the length of the first intermediate layer; for the second intermediate layer starting from the upper layer: 3 track portions extend in the direction of the width and 3 track portions extend in the direction of the length of the second intermediate layer;

and, for the lower layer: 6 track portions extend in the direction of the width and 3 track portions extend in the direction of the length of the lower layer.

7. The printed circuit as claimed in claim 4, wherein the first electrical terminal consists of two conductive pads connected to one another by a conductive track and one of said pads is connected by a conductive track to the first via of the n vias and the second electrical terminal consists of two conductive pads connected to one another by a conductive track and one of said pads is connected by a conductive track to the last via of the n vias, the first and second electrical terminals being borne by the upper layer of the printed circuit.

8. The printed circuit as claimed in claim 4, wherein the n vias of the control circuit each have a diameter equivalent to the smallest diameter of the other vias of the printed circuit.

9. The printed circuit as claimed in claim 4, wherein the track portions of the control circuit on each layer have a thickness equivalent to the thickness of the track extending over said layer.

10. The printed circuit as claimed in claim 4, wherein the control circuit is integrated into a functional part of the printed circuit.

* * * * *